United States Patent [19]
Kitsu

[11] Patent Number: 5,396,471
[45] Date of Patent: Mar. 7, 1995

[54] DATA PROTECTION CIRCUIT

[75] Inventor: Hiroo Kitsu, Tokyo, Japan

[73] Assignee: Kabushiki Kaisha Toshiba, Kawasaki, Japan

[21] Appl. No.: 216,284

[22] Filed: Mar. 23, 1994

[30] Foreign Application Priority Data

Mar. 29, 1993 [JP] Japan .................. 5-069678

[51] Int. Cl.⁶ .............................................. G11C 8/00
[52] U.S. Cl. ................... 365/230.01; 365/195; 365/230.08; 380/4
[58] Field of Search ............... 365/189.01, 230.01, 365/230.08, 195; 364/222.5; 380/4; 371/40.1

[56] References Cited

U.S. PATENT DOCUMENTS

| | | | |
|---|---|---|---|
| 4,519,036 | 5/1985 | Green | 364/200 |
| 4,521,853 | 6/1985 | Guttag | 364/200 |
| 4,590,552 | 5/1986 | Guttag et al. | 365/195 X |
| 4,864,542 | 9/1989 | Oshima et al. | 365/189.01 |
| 5,014,191 | 5/1991 | Padgaonkar et al. | 364/200 |
| 5,155,829 | 10/1992 | Koo | 395/425 |
| 5,264,742 | 11/1993 | Sourgen | 365/195 X |

FOREIGN PATENT DOCUMENTS

| | | |
|---|---|---|
| 5894195 | 6/1983 | Japan . |
| 60-57598 | 4/1985 | Japan . |
| 285945 | 3/1990 | Japan . |

Primary Examiner—Eugene R. LaRoche
Assistant Examiner—Son Dinh
Attorney, Agent, or Firm—Oblon, Spivak, McClelland, Maier & Neustadt

[57] ABSTRACT

A data protection circuit includes an address detection circuit, latch circuit and replacing circuit. The address detection circuit detects that an address signal for designating an address of a semiconductor memory has designated a specified address. The latch circuit latches a detection output of the address detection circuit. The replacing circuit replaces at least one bit of the address signal by readout data of the semiconductor memory in response to a latch output of the latch circuit.

20 Claims, 4 Drawing Sheets

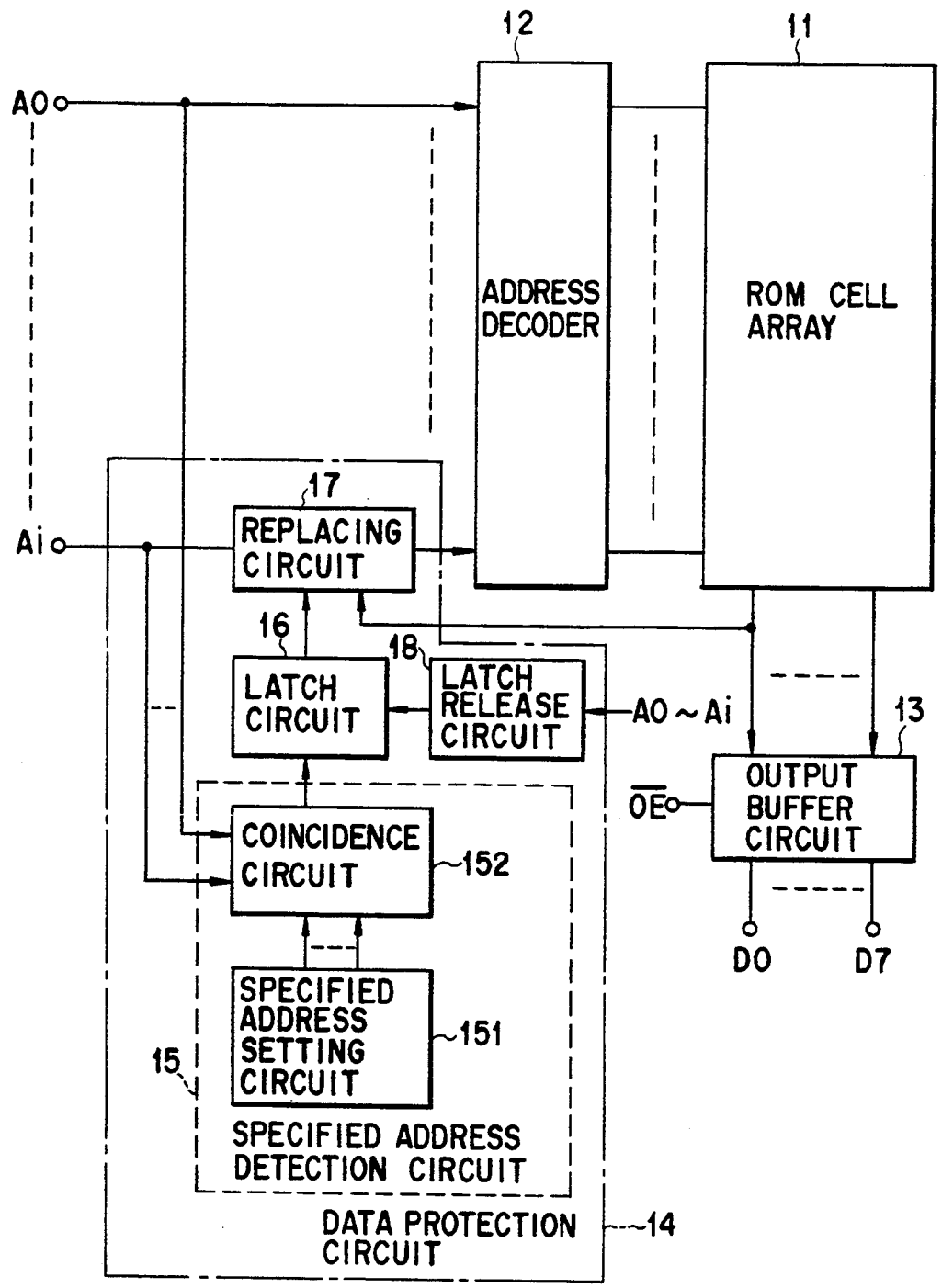
F I G. 1

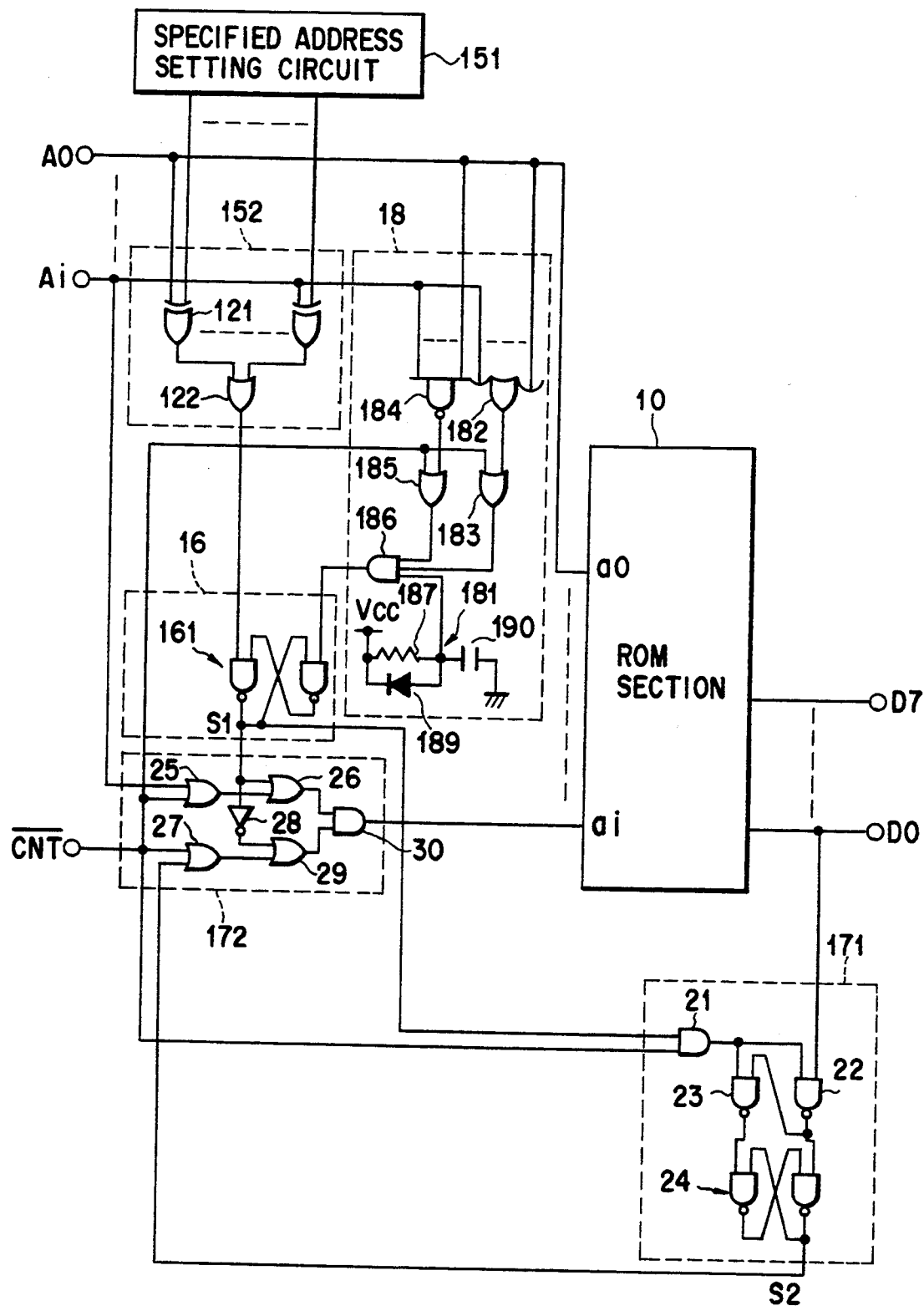
F I G. 2

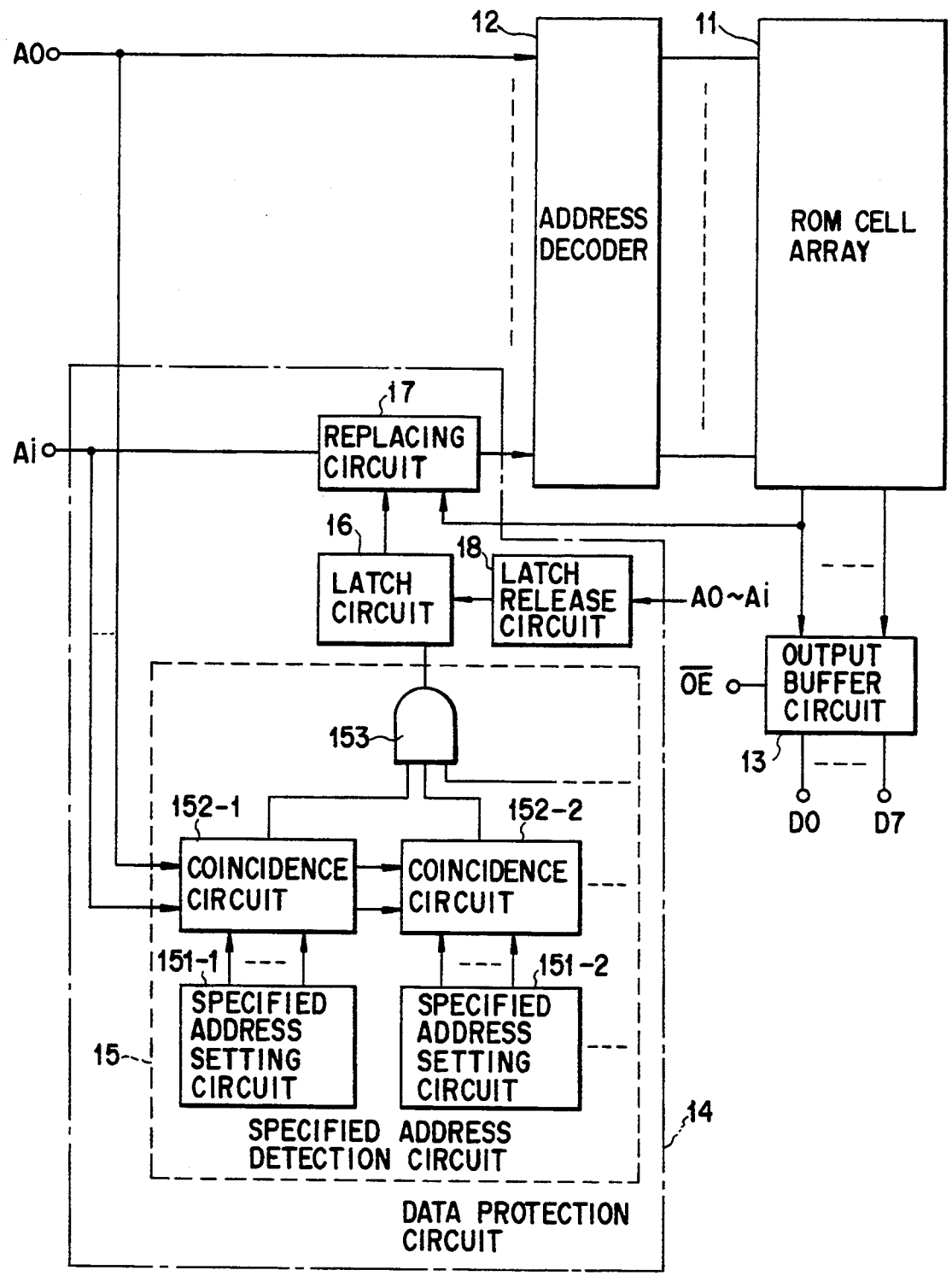
F I G. 4

DATA PROTECTION CIRCUIT

BACKGROUND OF THE INVENTION

1. Field of the Invention

This invention relates to a semiconductor memory such as a ROM (Read Only Memory), and more particularly to a data protection circuit for protecting stored programs and data from unjust readout for attaining dead copies or the like.

2. Description of the Related Art

In order to protect stored programs and data from unjust readout for attaining dead copies or the like, a data protection circuit is sometimes provided in the ROM.

Conventionally, in a data protection circuit which is now put into practice or proposed, if a specified address is designated when ROM addresses are scanned, one of the following processes (1) to (5) is effected for readout data corresponding to addresses succeeding the specified address.

(1) Output of the readout data is inhibited. This system is disclosed in Japanese Patent Disclosure (KOKAI) No. S.58-94195, for example.

(2) The readout data is converted into erroneous data by modifying the data by use of the address signal and then output.

(3) The readout data is converted into semi-fixed erroneous data with desired regularity and then output.

(4) The readout data is inverted to create erroneous data and then output. This system is disclosed in Japanese Patent Disclosure (KOKAI) No. S.60-57598, for example.

(5) The readout data is processed together with output data of a random data generation circuit in an operation circuit, converted into erroneous data and then output. This system is disclosed in Japanese Patent Disclosure (KOKAI) No. H.2-85945, for example.

However, in the processing system such as the process (1), it is easy for a person who tries unjust data readout to determine a specified address at which inhibition of output of readout data is started. Therefore, the possibility that data can be easily read out by reading out data without accessing the specified address becomes high.

Further, in the processes (2) to (4), data read out after the specified address is converted into erroneous data when the specified address is designated, but it is relatively easy to determine a specified address at which output of erroneous data is started, and if the specified address is determined, data can be read out in the same manner as in the process (1). That is, in the processing system (2), even if data is converted into erroneous data by modifying the data with the address signal, it is possible for the person who tries unjust data readout to analyze output data by taking the scan address into consideration since the address at the time of scanning is known. Further, in the process (3), the specified address may be easily detected based on the regularity of the semi-fixed erroneous data. Also, in the process (4), the specified address may be easily detected since data which is not usually used will be contained in the erroneous data, and correct data can be reproduced by inverting the erroneous data again.

As described above, if the specified address at which output of erroneous data is started is determined, data may be analyzed. The possibility of analysis also occurs when a plurality of specified addresses at which output of erroneous data is started are set.

In the process (5), it is relatively difficult to determine the specified address, but the hardware becomes complicated in construction and the chip cost rises.

Therefore, in addition to the above processes, it is considered to destroy ROM data when the specified address of the ROM is accessed. However, even in this case, data may be acquired by preparing another sample, jumping the specified address thereof and making access thereto. Further, it is not desirable to destroy ROM data when taking it into consideration that the qualified users of the ROM may erroneously access the specified address.

SUMMARY OF THE INVENTION

Accordingly, an object of this invention is to provide a data protection circuit capable of making it difficult to determine a specified address at which output of erroneous data is started and preventing unjust data readout.

Another object of this invention is to provide a data protection circuit capable of preventing unjust data readout without making the construction of the hardware complicated and raising the chip cost.

Still another object of this invention is to provide a data protection circuit capable of preventing unjust data readout and protecting data from being destroyed even if the qualified user erroneously accesses the specified address.

The above objects of this invention can be attained by a data protection circuit comprising a specified address detection circuit for detecting that an address signal for designating an address of a semiconductor memory has designated a specified address; a latch circuit for latching a detection output of the specified address detection circuit; and a replacing circuit for replacing at least one bit of the address signal by data read out from the semiconductor memory in response to a latch output of the latch circuit.

With the above construction, if a specified address is designated when addresses are scanned to unjustly read out data, at least one bit of the address signal is replaced by readout data in each of the addresses succeeding the specified address. As a result, readout data of each address succeeding the specified address is converted into erroneous data (meaningless data) having no relation with the original address.

Since the address signal is modified by use of readout data of the semiconductor memory, the relation of the output data with respect to the scan address becomes irregular and the output data is different from data having semi-fixed regularity, data which is not normally used, and data obtained by simply inverting the readout data and is obtained in the form of random data as if it is correctly read out.

Therefore, it becomes difficult for the person who tries unjust data readout to determine a specified address at which output of erroneous data is started even by taking the scan address which is determined into consideration, thus making it difficult to analyze output data.

Further, in comparison with the conventional system in which readout data is processed together with output data of a random data generation circuit in an operation circuit, converted into erroneous data and then output, the hardware can be simplified in construction and the chip cost can be lowered.

Further, since memory data is not destroyed when the specified address is accessed, data of the semiconductor memory will not be destroyed even if the qualified user erroneously accesses the specified address.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a block diagram showing part of a semiconductor memory, for illustrating a data protection circuit according to a first embodiment of this invention;

FIG. 2 is a circuit diagram showing an example of the detail construction of the data protection circuit shown in FIG. 1;

FIG. 4 is a block diagram showing part of a semiconductor memory, for illustrating a data protection circuit according to a second embodiment of this invention.

DETAILED DESCRIPTION OF THE PREFERRED EMBODIMENTS

Figure 3:
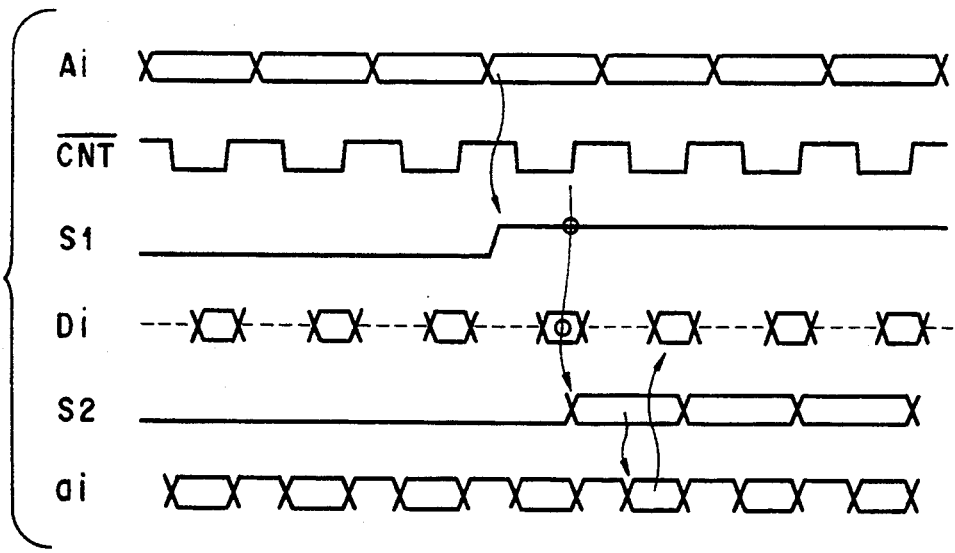
FIG. 3 is a timing chart for illustrating the operation of the circuit shown in FIGS. 1 and 2.

FIG. 1 shows extracted part of a semiconductor memory, for illustrating a data protection circuit according to a first embodiment of this invention. The memory is a 1-megabit ROM having a cell array 11 of 128K×8 bits configuration. An address decoder 12 decodes an address signal A0 to Ai to select at least one of word lines of the cell array 11. An output buffer circuit 13 outputs readout data from the cell array 11 to the exterior as an output signal D0 to D7 when an output enable signal $\overline{OE}$ is made active.

A data protection circuit 14 is mounted on the ROM chip. The data protection circuit 14 includes a specified address detection circuit 15, latch circuit 16, replacing circuit 17 and latch release circuit 18. The specified address detection circuit 15 detects that the address signal A0 to Ai has designated a specified address. The latch circuit 16 latches a detection output of the specified address detection circuit 15. The replacing circuit 17 replaces at least one bit (for example, Ai which is the most significant bit MSB) of the address signal A0 to Ai by at least one bit (for example, D0) of readout data D7 to D0 of the ROM in response to the latch output of the latch circuit 16. The latch release circuit 18 functions to detect the power-ON of the ROM, designation of the minimum address and designation of the maximum address and release the latching state of the latch circuit 16 when detecting any one of them.

The specified address detection circuit 15 includes a specified address setting circuit 151 and a coincidence circuit 152. Address data of a specified address is previously set in the specified address setting circuit 151 at the time of manufacturing the ROM. The coincidence circuit 152 compares address data set in the specified address setting circuit 151 with an input address signal and detects whether they are coincident with each other or not. As the specified address detection circuit 15, part of the address decoder 12 can be used. In this case, when the specified address is designated, an output signal of the partial decoder corresponding to the specified address may be supplied to and latched into the latch circuit 16, for example.

FIG. 2 shows an example of the concrete construction of the data protection circuit 14 shown in FIG. 1. A ROM section 10 in FIG. 2 includes the ROM cell array 11, address decoder 12 and output buffer circuit 13.

For example, the specified address setting circuit 151 is constructed by a data register. The coincidence circuit 152 includes exclusive-OR gates 121 of a number corresponding to the number of bits of the address signal A0 to Ai and an OR gate 122 to which outputs of the exclusive-OR gates 121 are input. An output of the OR gate 122 is supplied to the latch circuit 16 as an input signal.

The latch circuit 16 is constructed by an SR flip-flop circuit 161, for example, and the latch output S1 is set to the "H" level when receiving a coincidence signal (for example, "L" level) from the coincidence circuit 152.

The latch release circuit 18 includes a power-ON reset signal creation circuit 181, OR gate 182, OR gate 183, NAND gate 184, OR gate 185 and 3-input AND gate 186. The power-ON reset signal creation circuit 181 includes a resistor 187, diode 189 and capacitor 190, and creates a reset signal which rises with slight delay when the power supply switch of the ROM is turned ON. The OR gate 182 (part of the address decoder 12 may be used) detects that the address signal A0 to Ai has designated the minimum address. The OR gate 183 is used to derive an output of the OR gate 183 in response to a control signal $\overline{CNT}$. The NAND gate 184 (part of the address decoder 12 may be used) detects that the address signal has designated the maximum address. The OR gate 185 is used to derive an output of the NAND gate 184 in response to a control signal $\overline{CNT}$. The AND gate 186 is supplied with output signals of the OR gates 183, 185 and an output signal of the power-ON reset signal creation circuit 181, and an output signal of the AND gate 186 is supplied to the latch circuit 16 as a reset input. As a result, the latching state of the latch circuit 16 is released by the output signal of the power-ON reset signal creation circuit 181 at the time of turn-ON of the power supply, or the latching state of the latch circuit 16 is released by setting the control signal $\overline{CNT}$ to the "L" level and designating the maximum address or minimum address.

A readout data selection circuit 171 and address switching circuit 172 constitute the replacing circuit 17 shown in FIG. 1. The readout data selection circuit 171 functions to select one bit of readout data of the ROM in response to the latching state of the latch circuit 16. The readout data selection circuit 171 includes an AND gate 21, first NAND gate 22, second NAND gate 23 and SR flip-flop circuit 24. The control signal $\overline{CNT}$ and a latch output S1 of the latch circuit 16 are input to the AND gate 21. An output of the AND gate 21 and one bit (D0 in FIG. 2) of the readout data D7 to D0 are input to the first NAND gate 22. An output of the first NAND gate 22 and an output of the AND gate 21 are input to the second NAND gate 23. An output of the first NAND gate 22 and an output of the second NAND gate 23 are input to the SR flip-flop circuit 24 and an output S2 of the flip-flop circuit 24 is supplied to the address switching circuit 172.

The address switching circuit 172 switches one of the bits of the address signal A0 to Ai to an output of the readout data selection circuit 171 in response to a latch output of the latch circuit 16 and supplies the same to the address decoder 12. The address switching circuit 172 includes a first OR gate 25, second OR gate 26, third OR gate 27, inverter circuit 28, fourth OR gate 29 and AND gate 30. One bit Ai among the address signal A0 to Ai and the control signal $\overline{CNT}$ are input to the first OR gate 25. An output of the first OR gate 25 and a latch output of the latch circuit 16 are input to the second OR gate 26. An output of the readout data selection circuit 171 and the control signal $\overline{CNT}$ are input to the third OR gate 27. A latch output S1 of the latch circuit 16 is supplied to the inverter 28. An output of the inverter 28 and an output of the third OR gate 27 are supplied to the fourth OR gate 29. An output of the second OR gate 26 and an output of the fourth OR gate 29 are input to the AND gate 30 and an output of the AND gate 30 is supplied to the ROM section 10 as part ai of an internal address signal a0 to ai.

The address switching circuit 171 selects one bit Ai of the address signal A0 to Ai as ai when the latch output S1 of the latch circuit 16 is at the "L" level and selects an output of the readout data selection circuit 171 as ai when the latch output S1 of the latch circuit 16 is at the "H" level.

Next, the operation of the data protection circuit is explained with reference to the flowchart shown in FIG. 3.

In general, when a program to be stored in the ROM is created, some non-use addresses are provided. In this example, assume that at least one of the non-use addresses which is known only to the designer is used as a specified address.

In the circuit shown in FIGS. 1 and 2, when the addresses of the ROM are scanned for unjust data readout and the specified address is designated, the latch output S1 is set to the "H" level, part Di (in this example, one bit D0) of the readout data is selected, and part Ai (in this example, MSB) of the address signal for a next address is replaced (supplied as an internal address ai) by use of the selection data S2. That is, the address signal of each address succeeding the designated specified address is modified by use of part of the readout data.

As a result, as the readout data of the address succeeding the designated specified address, data of an address obtained by changing the MSB of the original address is read out, and thus, erroneous data (meaningless data) having no particular relation with the original data is obtained. In this case, if the MSB is changed from "1" to "0" or in a reverse direction, data of an address which is far apart from the original address is read out.

Thus, since the address signal is modified by use of readout data of the memory,, the relation of the output data with respect to the scan address becomes irregular and the output data is different from data having semi-fixed regularity, data which is not normally used, and data obtained by simply inverting the readout data and is obtained in the form of random data as if it is correctly read out.

Therefore, it becomes difficult for the person who tries unjust data readout to determine a specified address at which output of erroneous data is started even by taking the scan address which is known to him into consideration, thus making it difficult to analyze output data.

In order to detect a portion of the readout data at which correct readout data ends and erroneous data starts, it is necessary to repeatedly effect the operation of deriving readout data for each address by sequentially designating all of the addresses or repeatedly effect the operation of partially analyzing a program containing erroneous output data.

However, the amount of the above operations becomes large in a condition that memories of large capacity are used in recent years. As a result, the operation of an amount which is equal to or larger than an amount of the operation necessary for newly developing a program equivalent to data subjected to unjust readout becomes necessary and it can be expected that the person will give up unjustly acquiring data when taking the comparison of the amounts of operations into consideration.

The above-described output data analysis becomes more difficult when setting a plurality of specified addresses at which output of erroneous data is started. In order to set a plurality of specified addresses, it is only necessary to provide a plurality of specified address setting circuits 151-1, 151-2,—and a plurality of coincidence circuits 152-1, 152-2,—for the respective specified addresses as shown in FIG. 4, derive the logical product of outputs of the coincidence circuits 152-1, 152-2,—by use of an AND gate 153, and input the logical product to the latch circuit 16.

Further, in comparison with the conventional system in which readout data is processed together with output data of the random data generation circuit in an operation circuit, converted into erroneous data and then output, the hardware can be simplified in construction and a rise in the chip cost can be suppressed.

Further, since this system is different from the system in which memory data is destroyed when a specified address is accessed, memory data will not be destroyed even if the qualified user erroneously accesses the specified address. Even if the qualified user erroneously accesses the specified address and this system runs incessantly without performing any function, the operation of the memory can be normally started again by turning ON the power supply, designating the minimum address, or designating the maximum address after this since the latch release circuit 18 is provided.

In the first embodiment, the replacing circuit 17 replaces one bit (MSB) of the address signal by one bit of readout data. However, the number of bits to be replaced is not limited to one, and a plural-bit replacing circuit may be used to replace a plurality of bits of the address signal by a plurality of bits of readout data. Further, this invention is not limited to the above semiconductor memory, and a data protection circuit may be mounted on a memory (on-chip memory) formed in a logic integrated circuit, for example.

Figure 5:
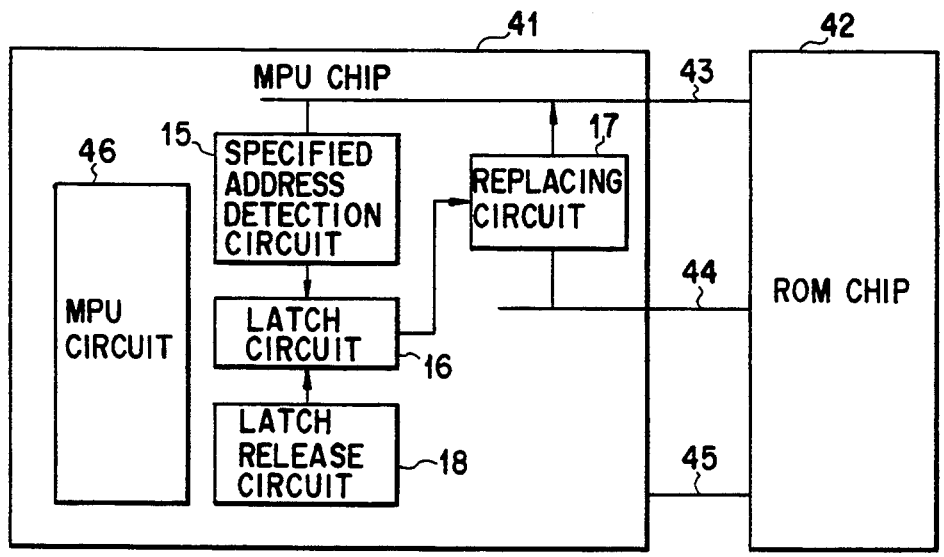
FIG. 5 is a block diagram showing an example of the construction obtained when a data protection circuit is mounted on a chip different from a semiconductor memory, for illustrating a data protection circuit according to a third embodiment of this invention.

FIG. 5 shows an example of the construction obtained when a data protection circuit is mounted on a chip different from a semiconductor memory, for illustrating a data protection circuit according to a third embodiment of this invention.

An MPU (microprocessor unit) chip 41 and ROM chip 42 are connected to each other via an address bus 43, data bus 44 and control signal line 45. In the MPU chip 41, the specified address detection circuit 15, latch circuit 16, replacing circuit 17 and latch release circuit 18 which are described in the former embodiment are provided in addition to an MPU circuit 46. In the ROM chip 42, the cell array 11, address decoder 12 and output buffer circuit 13 in the circuit of FIG. 1 are provided.

When the data protection circuit is formed in the MPU chip 41 as described above, data in the ROM chip 42 can be protected in the same manner as described in the first and second embodiments.

As described above, according to the data protection circuit of this invention, it is possible to make it difficult to determine a specified address of the memory at which output of erroneous data is started when unjust data readout from the semiconductor memory is tried, and even if the qualified user erroneously accesses the specified address, memory data will not be destroyed and the construction of the hardware can be prevented from being complicated and a rise in the chip cost can be suppressed.

Thus, softwares formed with increasing labor cost and time in recent years can be relatively easily and completely protected simply by specifying a non-use address or addresses at the time of formation of the integrated circuit, and the softwares can be preferentially differentiated from and get an advantage over the competitive softwares.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A data protection circuit comprising:
    specified address detection means for detecting that an address signal for designating an address of a semiconductor memory has designated a specified address;
    latch means for latching a detection output of said specified address detection means; and
    replacing means for replacing at least one bit of the address signal by data read out from said semiconductor memory in response to a latch output of said latch means.

2. A data protection circuit according to claim 1, wherein said latch means and replacing means are formed in the chip of said semiconductor memory and part of an address decoder of said semiconductor memory is used as said specified address detection means.

3. A data protection circuit according to claim 1, wherein said latch means and replacing means are formed in a semiconductor chip different from said semiconductor memory.

4. A data protection circuit according to claim 1, further comprising latch release means for detecting at least one of the turn-ON of the power supply of said semiconductor memory, designation of the minimum address of said semiconductor memory, and designation of the maximum address of said semiconductor memory and releasing the latching state of said latch means.

5. A data protection circuit according to claim 1, wherein the address signal replaced by means of said replacing means includes a most significant bit.

6. A data protection circuit according to claim 1, wherein said semiconductor memory is a ROM.

7. A data protection circuit according to claim 1, wherein said specified address detection means includes specified address setting means having specified address data previously set therein; and coincidence means for comparing address data set in said specified address setting means with an input address signal to detect the coincidence therebetween.

8. A data protection circuit according to claim 7, wherein said latch means includes an SR flip-flop circuit which is set when the coincidence is detected by said coincidence means.

9. A data protection circuit according to claim 1, wherein said replacing means includes readout data selection means for selecting one bit of readout data of said semiconductor memory according to the latching state of said latch means; and address switching means for switching one bit of the address signal to an output of said readout data selection means according to the latching state of said latch means and outputting the same to an address decoder.

10. A data protection circuit according to claim 4, wherein said latch release means includes a power-ON reset signal creation circuit for creating a reset signal at the time of turn ON of the power supply; first logic means for detecting that the address signal designates the minimum address; second logic means for deriving an output of said first logic means in response to a control signal; third logic means for detecting that the address signal designates the maximum address; fourth logic means for deriving an output of said third logic means in response to the control signal; and fifth logic means for deriving a logical product signal of the reset signal output from said power-ON reset signal creation circuit, output signal of said second logic means and output signal of said fourth logic means to release the latch state of said latch means.

11. A semiconductor integrated circuit device comprising:
    a specified address detection circuit for detecting that an address signal for designating an address of a semiconductor memory has designated a specified address;
    a latch circuit for latching a detection output of said specified address detection circuit; and
    a replacing circuit for replacing at least one bit of the address signal by readout data of said semiconductor memory in response to a latch output of said latch circuit.

12. A semiconductor integrated circuit device according to claim 11, wherein said latch circuit and replacing circuit are formed in the chip of said semiconductor memory and part of an address decoder of said semiconductor memory is used as said specified address detection circuit.

13. A semiconductor integrated circuit device according to claim 11, wherein said latch circuit and replacing circuit are formed in a semiconductor chip different from said semiconductor memory.

14. A semiconductor integrated circuit device according to claim 11, further comprising a latch release circuit for detecting at least one of the turn-ON of the power supply of said semiconductor memory, designation of the minimum address of said semiconductor memory, and designation of the maximum address of said semiconductor memory and releasing the latching state of said latch circuit.

15. A semiconductor integrated circuit device according to claim 11, wherein the address signal replaced by means of said replacing circuit includes a most significant bit.

16. A semiconductor integrated circuit device according to claim 11, wherein said semiconductor memory is a ROM.

17. A semiconductor integrated circuit device according to claim 11, wherein said specified address detection circuit includes a specified address setting circuit having specified address data previously set therein; and a coincidence circuit for comparing address data set in said specified address setting circuit with an input address signal to detect the coincidence therebetween.

18. A semiconductor integrated circuit device according to claim 17, wherein said latch circuit includes an SR flip-flop circuit which is set when the coincidence is detected by said coincidence circuit.

19. A semiconductor integrated circuit device according to claim 11, wherein said replacing circuit includes a readout data selection circuit for selecting one bit of readout data of said semiconductor memory according to the latching state of said latch circuit; and an address switching circuit for switching one bit of the address signal to an output of said readout data selection circuit according to the latching state of said latch circuit and outputting the same to an address decoder.

20. A semiconductor integrated circuit device according to claim 14, wherein said latch release circuit includes a power-ON reset signal creation circuit for creating a reset signal at the time of turn ON of the power supply; a first OR gate for receiving an address signal and detecting that the address signal designates the minimum address; a second OR gate for receiving an output of said first OR gate and a control signal; a NAND gate for receiving the address signal and detecting that the address signal designates the maximum address; a third OR gate for receiving an output of said NAND gate and the control signal; and an AND gate for receiving output signals of said power-ON reset signal creation circuit, second OR gate and third OR gate to output a reset signal of said latch circuit.

* * * * *